United States Patent
Johnson et al.

(10) Patent No.: US 6,597,836 B2
(45) Date of Patent: Jul. 22, 2003

(54) OPTICAL PHASED ARRAY CONTROL SYSTEM

(75) Inventors: Bartley C. Johnson, North Andover, MA (US); Jack H. Hollister, Chesterfield, MO (US)

(73) Assignee: The Boeing Company, Chicago, IL (US)

( * ) Notice: Subject to any disclaimer, the term of this patent is extended or adjusted under 35 U.S.C. 154(b) by 206 days.

(21) Appl. No.: 09/885,670

(22) Filed: Jun. 20, 2001

(65) Prior Publication Data

US 2003/0002790 A1 Jan. 2, 2003

(51) Int. Cl.[7] ................................................ G02B 6/32
(52) U.S. Cl. ...................................................... 385/33
(58) Field of Search .............................. 385/33, 39, 41, 385/42, 31; 372/31, 26, 29.01, 6

(56) References Cited

U.S. PATENT DOCUMENTS

| | | | |
|---|---|---|---|
| 4,661,786 A | 4/1987 | Bender | 359/240 |
| 4,937,539 A | 6/1990 | Grinberg et al. | 349/202 |
| 5,151,814 A | 9/1992 | Grinberg et al. | 359/209 |
| 5,577,138 A | * 11/1996 | Chandrasekhar et al. | 385/14 |
| 5,694,408 A | 12/1997 | Bott et al. | 372/6 |
| 5,717,516 A | * 2/1998 | Klein et al. | 359/334 |
| 5,862,279 A | 1/1999 | Amersfoort et al. | 385/40 |
| 6,200,309 B1 | * 3/2001 | Rice et al. | 606/10 |
| 6,275,250 B1 | * 8/2001 | Sanders et al. | 347/247 |
| 6,519,385 B1 | * 2/2003 | Green | 385/27 |

* cited by examiner

Primary Examiner—Tulsidas Patel
(74) Attorney, Agent, or Firm—Harness, Dickey & Pierce, P.L.C.

(57) ABSTRACT

A real-time control system for an optical phased array is disclosed that comprises a computationally efficient algorithm for calculating phase differences between a plurality of array beamlets and a reference plane wave and further generates phase correction signals that are transmitted to a plurality of phase modulators to realign the array beamlets to compensate for external perturbations and atmospheric aberrations. The phase measurements are based on a phase angle of a complex number comprising square wave functions, and alternately, based on a phase angle of a complex number comprising sine and cosine functions to correct for harmonic content of phase measurements. Furthermore, the phase correction signal is based on the phase measurement times modulo$2\pi$.

22 Claims, 2 Drawing Sheets

OPTICAL PHASED ARRAY CONTROL SYSTEM

FIELD OF THE INVENTION

The present invention relates generally to optical phased arrays and more particularly to control systems for optical phased arrays that compensate for phase changes due to external perturbations such as vibration and thermal variations as well as compensating for atmospheric aberrations external to a laser system.

BACKGROUND OF THE INVENTION

Optical phased arrays are well known in the art and are used in a variety of applications for the purpose of generating an optical output having greater power than an optical input through the use of an array of emitters. More specifically, optical phased arrays have been used in laser systems to generate an output beam having high power levels in addition to high beam quality or brightness. High beam quality allows available light to be concentrated onto a small area at a large distance, which is advantageous in laser weapons systems.

The optical phased array is similar to phased array radar, wherein an array of emitters must be emitting light at precisely the same phase. However, matching the phases of the emitters at optical frequencies is more difficult than with radio frequencies, as used with phased array radar, due to the short wavelength of light. Additionally, external perturbations such as vibrations and thermal variations continuously alter the phase of each emitter. Further, atmospheric aberrations external to the laser system also change the phase of the emitters, wherein a control system may generate an arbitrary phase front to compensate for atmospheric propagation perturbations. Accordingly, a control system must be employed to realign the emitters to compensate for phase changes due to external perturbations and atmospheric aberrations.

Generally, control systems measure the phase of each emitter compared with the phase of a reference signal and feedback phase correction signals to phase modulators that realign the phase of each emitter. Such techniques are referred to as near-field techniques, wherein the phase of each emitter is measured and controlled by using an interferometer to compare the phase of each emitter to the phase of a reference signal. See, for example, U.S. Pat. No. 5,694,408 to Bott et. al., assigned to McDonnell Douglas Corporation, the disclosure of which is incorporated by reference in its entirety herein. The phase modulators may realign the phases of the emitters to match a reference signal, or alternately, the phase modulators may realign the phases of the emitters to produce an output beam having a specific phase profile or phase taper. Furthermore, microprocessors having algorithms to calculate phase measurements and corrections are also employed in the known art.

Unfortunately, the algorithms that are used in the known art to calculate phase measurements and corrections are computationally intensive and thus may not be capable of providing real-time feedback to the phase modulators if the optical phased array comprises a large number of emitters. For example, known art algorithms that use the near-field technique repeatedly sweep a reference beam by $2\pi$ radians while measuring the output for each emitter. Generally, timing information is used from the start of the sweep to the time when the output appears to determine the phase of the emitter, and the algorithm is further sensitive to the AC amplitude of the interferometer signal and also to the DC component thereof. As a result, the algorithm is computationally intensive and consumes valuable time that is needed to continuously correct the phases of the emitters. Additionally, conventional techniques are phase-nulling, and thus the control system cannot lock to an arbitrary phase front to compensate for atmospheric propagation perturbations.

In addition to the near-field techniques, far-field techniques have also been employed in the known art to control elements of an optical phased array. The far-field technique has been used to align an array of semiconductor laser amplifiers by dithering the phases of the elements to achieve a beam with the narrowest far-field divergence. Unfortunately, the computational requirements of the near-field technique scale superlinearly in relation to the number of elements. Furthermore, the signal to noise ratio degrades linearly with the number of elements. As a result, laser systems comprising a large number of emitters for higher power output cannot be controlled real-time due to the computational time required.

Accordingly, there remains a need in the art for an optical phased array control system that comprise computationally efficient algorithms in order to provide real-time feedback to compensate for phase changes due to external perturbations. Further, the algorithms should preferably be capable of calculating phase measurements and corrections with relatively high fidelity. Moreover, the algorithms should be capable of generating arbitrary phase-fronts for corrections due to atmospheric aberrations.

SUMMARY OF THE INVENTION

In one preferred form, the present invention provides an optical phased array control system comprising a master oscillator laser that produces a beam, which is split into a reference beam and a plurality of array beamlets. Generally, the phase of the reference beam and the phase of the array beamlets are measured and compared, wherein a computationally efficient algorithm computes both phase measurements and phase corrections. Accordingly, phase correction signals are transmitted to a plurality of phase modulators that correspond to each of the array beamlets. The phase modulators then realign the phases of the array beamlets to compensate for external perturbations.

In operation, the array beamlets are first transmitted through a first fiber array where the beamlets are diverged into a first microlens array. Accordingly, the first microlens array generates a composite beam that is transmitted as an output beam from the system. The composite beam is further transmitted and interfered with a reference plane wave that is generated from the reference beam. The composite beam and the reference plane wave are then transmitted through a second microlens array where the array beamlets and the reference plane wave are focused to a second fiber array. The second fiber array then transmits the array beamlets and the reference plane wave to a plurality of photodetectors, which correspond with the array beamlets, wherein the photodetectors detect the phases of the reference plane wave and the array beamlets. Subsequently, the output from the photodetectors is transmitted to a computing device, such as a personal computer (PC), wherein the algorithm calculates a phase measurement and corrections.

The phase measurement is generally the difference between the phase of a specific array beamlet and the phase of the reference plane wave. In addition, the phase correction for each array beamlet is calculated based on the phase measurement, as described in greater detail below. The phase correction signal is then transmitted to the phase modulators, which realign the phases of the array beamlets to match the phase of the reference beam such that a flat phase front is generated. Alternately, an arbitrary phase-front is generated to correct for atmospheric aberrations.

As a part of the real-time control system, the reference plane wave is ramped from 0 to $2\pi$ radians using a reference phase modulator. Preferably, the ramp is achieved in four equally spaced steps for optimal results. Accordingly, a trigger is employed to send signals to the phase modulator and to the personal computer, wherein the algorithm uses a signal from the trigger to calculate the phase measurements and corrections as described in greater detail below.

The phase measurement according to the algorithm is calculated based on a difference between the phase of the array beamlets and the phase of the reference plane wave. More specifically, the phase measurement is based on a phase angle of a complex number comprising square wave functions. The square wave functions are insensitive to AC amplitudes and DC components of the phase of the array beamlets and the phase of the reference plane wave, and as a result, the computations are less intensive and are capable of supporting real-time feedback to the phase modulators. In another form, the phase measurement is calculated based on a phase angle of a complex number comprising sine and cosine functions to correct for harmonic content of the phases of the array beamlets and the reference plane wave.

The phase corrections are calculated based on the phase measurement calculation times modulo$2\pi$. The phase correction signal is cumulative, and thus a current phase correction is subtracted from a previous phase correction for each cycle that measures phases and calculates the phase measurements and corrections. Accordingly, the cycle must be faster that the external perturbations in order to provide real-time phase control.

In another form, a plurality of PCs may be employed for a large number of array beamlets, thereby reducing the computing load. As a result, a parallel real-time phase control system may be used that is capable of controlling relatively large optical phased arrays without exceeding available computing resources.

Further areas of applicability of the present invention will become apparent from the detailed description provided hereinafter. It should be understood that the detailed description and specific examples, while indicating the preferred embodiment of the invention, are intended for purposes of illustration only and are not intended to limit the scope of the invention.

BRIEF DESCRIPTION OF THE DRAWINGS

The present invention will become more fully understood from the detailed description and the accompanying drawings, wherein.

DETAILED DESCRIPTION OF THE PREFERRED EMBODIMENTS

The following description of the preferred embodiments is merely exemplary in nature and is in no way intended to limit the invention, its application, or uses.

Optical Phased Array Architecture

Figure 1:
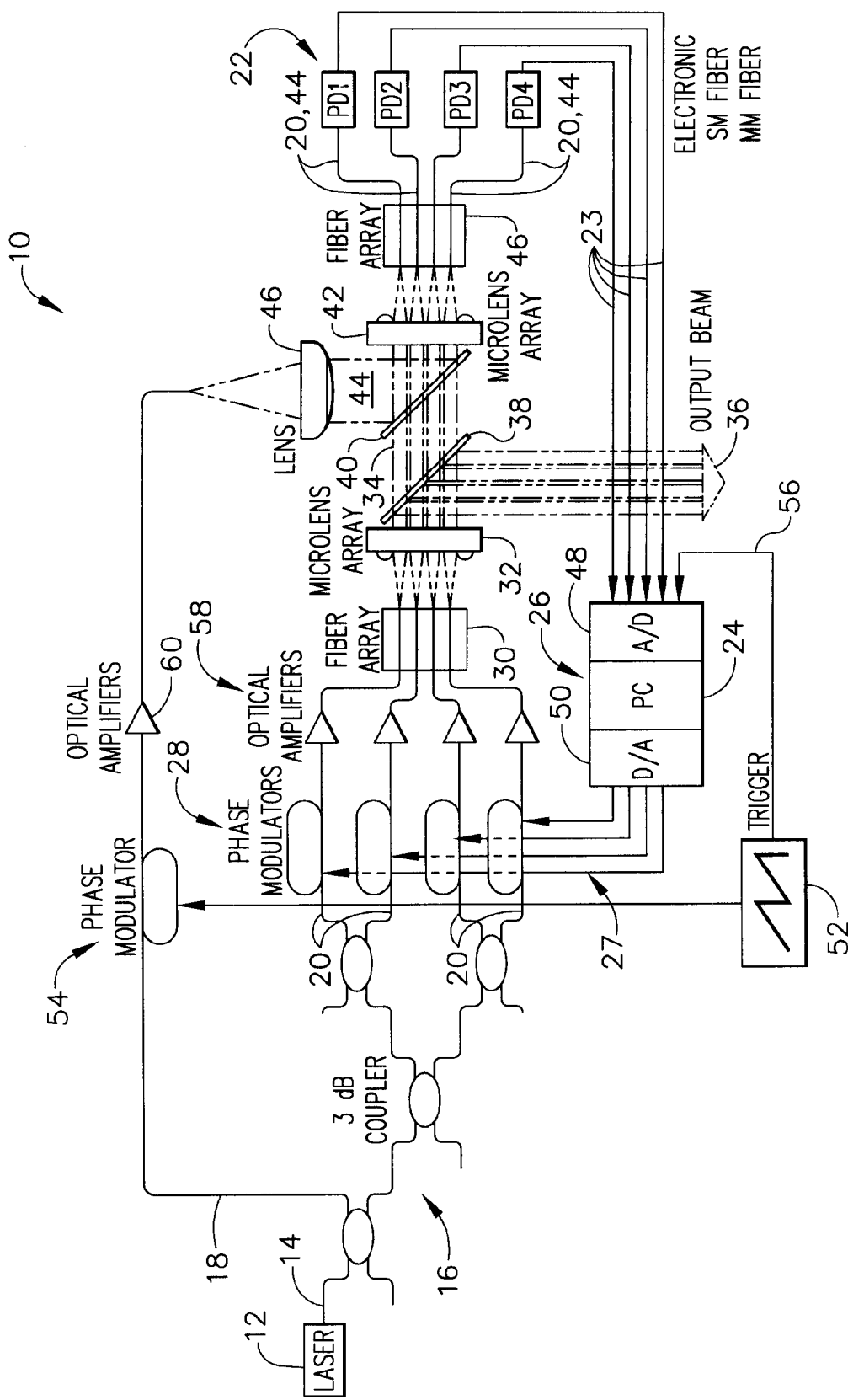
FIG. 1 is a schematic of the optical phased array control system in accordance with a preferred embodiment of the present invention.

Referring to the drawings, a real-time control system for an optical array according to the present invention is illustrated and generally indicated by reference numeral 10 in FIG. 1. As shown, the real-time control system 10 comprises a master oscillator laser 12 having a beam 14 that is split by a signal power splitter 16 into a reference beam 18 and a plurality of array beamlets 20. Preferably, the power splitter 16 is a passive coupler, such as the 3 dB coupler as illustrated.

Generally, the phases of the array beamlets 20 and the reference beam 18 are detected by a corresponding set of photodetectors 22, which transmit the phases in photodetector output signals 23 to an algorithm 24 within a computing device 26. The algorithm 24 calculates phase measurements and phase corrections based on the phase of the array beamlets 20 compared with the reference beam 18, and transmits phase correction signals 27 to a corresponding set of phase modulators 28. Accordingly, the phase modulators 28 realign the phases of array beamlets 20 to compensate for external perturbations.

As further shown, the array beamlets 20 are transmitted through a first fiber array 30, where the array beamlets 20 diverge into a first microlens array 32 that generates a composite beam 34. The composite beam 34 is transmitted as an output beam 36 by a first beam splitter 38, and is further transmitted through a second beam splitter 40 to a second microlens array 42. Additionally, a high quality reference plane wave 44 is generated from the reference beam 18, preferably using a collimating lens 46. The reference plane wave 44 is then interfered with the composite beam 34 by the second beam splitter 40, and the reference plane wave 44 is also transmitted to the second microlens array 42.

The second microlens array 42 focuses both the composite beam 34, which comprises array beamlets 20, and the reference plane wave 44 to a second fiber array 46, which transmits the array beamlets 20 and the reference plane wave 44 to the photodetectors 22. Accordingly, the photodetectors 22 detect the phase of each array beamlet 20 and the reference plane wave 44 and subsequently transmit the phases to the computing device 26 through photodetector output signals 23. As shown, the computing device 26 further comprises an analog to digital converter 48 that converts an analog output of the photodetectors 22 to a digital input for the algorithm 24.

Generally, the algorithm 24 calculates a phase measurement, which is the difference between the phase of an individual array beamlet 20 and the phase of the reference plane wave 44. The phase measurement is further used to calculate a phase correction that is used for the phase correction signals 27, which are transmitted to the phase modulators 28 to correct for phase changes. Accordingly, the computing device 26 further comprises a digital to analog converter 50 that converts the digital signals from the algorithm 24 to an analog signal for the phase correction signals 27. Both the phase measurement and the phase correction calculations of the algorithm 24 are described in greater detail below.

A trigger 52 is used to ramp the phase of reference plane wave 44 from 0 to $2\pi$ radians through the use of a reference phase modulator 54. The trigger 52 also generates a trigger signal 56 that is used by the algorithm 24 as described in greater detail below. As further shown, optical amplifiers 58 may further be employed to amplify the array beamlets 20 as necessary. Additionally, a reference amplifier 60 may also be employed to amplify the reference beam 18 as necessitated by the particular application requirements. Although a total of four (4) array beamlets 20 are illustrated herein along with corresponding elements (phase modulators 28, photodetectors 22), it shall be appreciated by those skilled in the art that any number of array beamlets 20 and elements may be employed according to the teachings of the present invention.

Accordingly, a real-time control system 10 is used to realign the phases of the array beamlets 20 to compensate for external perturbations. As shown, the real-time control system 10 is a closed-looped system that continuously provides feedback to the phase modulators 28 during continued operation of the master oscillator laser 12.

Algorithm

Generally, the algorithm 24 functions according to three (3) primary cycles: (1) ramping the reference plane wave 44 from 0 to $2\pi$ radians and digitizing n points of the photodetector output signals 23; (2) computing the phase measurement, $\Phi_M$, which is the phase difference between the reference plane wave phase and an array beamlet phase; and (3) sending a phase correction signal, $\Phi_E$, to each phase modulator 28 that corresponds with an array beamlet 20 to ensure that each array beamlet 20 is in phase with the reference plane wave 44. Preferably, n=4 in one form of the present invention, wherein optimal signal to noise ratios have been achieved in preliminary physical systems.

Figure 2:
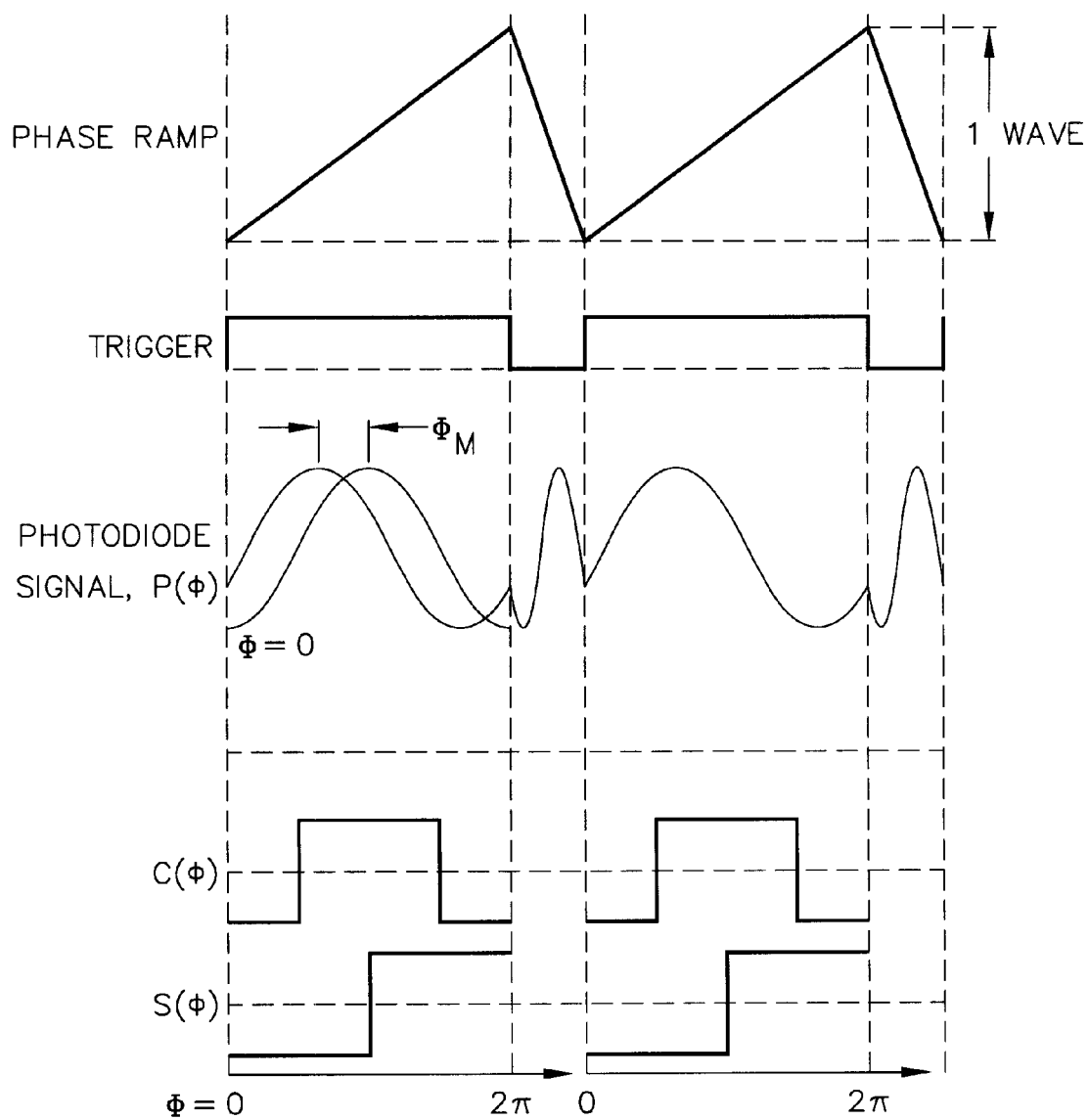
FIG. 2 is a diagram of the sinusoidal photodetector output as the reference plane wave is ramped from 0 to $2\pi$ radians, in addition to the square wave functions of the phase measurement, in accordance with the present invention.

Referring to FIG. 2, the sinusoidal photodetector output, $p(\phi)$, is shown as the reference plane wave 44 is ramped from 0 to $2\pi$ radians. As further illustrated, two square wave functions, $c(\phi)$ and $s(\phi)$ are also used by the algorithm 24, which are a part of the phase measurement calculation as more fully described in the following. Further, the trigger signal is also a square wave function. Accordingly, the square wave functions ignore the DC component of $p(\phi)$ and are further insensitive to the AC amplitude of $p(\phi)$, which greatly simplifies the calculations of the algorithm 24.

The phase measurement, $\Phi_M$, is calculated according to Equation 1:

$$\Phi_M = arg(I+jQ), \quad \text{(Eq. 1)}$$

Where arg( ) denotes the argument, or phase angle, of the complex number I+jQ. Accordingly, I and Q are defined (for one ramp of reference plane wave 44) according to Equations 2 and 3:

$$I = \int p(\phi) c(\phi) d\phi \quad \text{(Eq. 2)}$$

$$Q = \int p(\phi) s(\phi) d\phi, \quad \text{(Eq. 3)}$$

Where $c(\phi)$ and $s(\phi)$ are the square wave functions according to FIG. 2.

In another preferred form, $c(\phi)$ and $s(\phi)$ may alternately be $\cos(\phi)$ and $\sin(\phi)$ functions. As a result, the sine and cosine functions screen against harmonic content in $p(\phi)$. Accordingly, if $p(\phi)$ is not a perfectly sinusoidal signal, $c(\phi)$ and $s(\phi)$ may result in a slight phase measurement error if $p(\phi)$ has an undesirable harmonic content. However $c(\phi)$ and $s(\phi)$ are more computationally efficient than $\cos(\phi)$ and $\sin(\phi)$ since $\cos(\phi)$ and $\sin(\phi)$ would require additional multiplication steps.

For a sampling of n points of $p(\phi)$, I and Q are computed according to Equations 4 and 5:

$$I = \sum_{i=0}^{n} p(\phi_i) c(\phi_i) \quad \text{(Eq. 4)}$$

$$Q = \sum_{i=0}^{n} p(\phi_i) s(\phi_i) \quad \text{(Eq. 5)}$$

The application of the present invention to an optical phased array when n=4 (wherein the signal to noise ratio is optimized) as illustrated herein would result in the following computation for the phase measurement, $\Phi_M$, according to Equation 6:

$$\Phi_M = arg[(p(\pi)-p(0))+j(p(3\pi/2)-p(\pi/2))] \quad \text{(Eq. 6)}$$

Once the phase measurement, $\Phi_M$, is calculated, the algorithm 24 next computes a phase correction, $\Phi_E$, so that a phase correction signal 27 may be sent to each phase modulator 28 to realign the array beamlets 20. Accordingly, the phase correction, $\Phi_E$, which is cumulative, is computed for the ith measurement/cycle according to Equation 7:

$$\Phi_E = \Phi_E[i-1] - \Phi_M[i] \; modulo \, 2\pi \quad \text{(Eq. 7)}$$

As the optical phased array is being perturbed by external sources, the calculations are computationally efficient such that the phase modulators 28 realign the array beamlets 20 corrections at a rate faster than the external perturbations. As a result, a computationally efficient and accurate real-time control system for a variety of optical phased arrays in many applications is provided by the present invention.

The description of the invention is merely exemplary in nature and, thus, variations that do not depart from the gist of the invention are intended to be within the scope of the invention. Such variations are not to be regarded as a departure from the spirit and scope of the invention.

What is claimed is:

1. A real-time control system for an optical phased array comprising:
    a master oscillator laser that generates a beam;
    a signal power splitter that splits the beam into a reference beam and a plurality of array beamlets, wherein each said array beamlet comprises a phase;
    a plurality of phase modulators corresponding to the array beamlets that vary the phase of the array beamlets;
    a reference plane wave that is generated from the reference beam and is interfered with the array beamlets, the reference plane wave comprising a phase;
    a plurality of photodetectors that detect the phase of each array beamlet and the phase of the reference plane wave; and
    an algorithm that provides phase correction signals to the phase modulators,
    wherein the phases of the array beamlets are aligned such that a composite beam is generated that is compensated for external perturbations.

2. The real-time control system of claim 1, wherein the algorithm further comprises a phase measurement that calculates a difference between the phase of an array beamlet and the phase of the reference plane wave based on a phase angle of a complex number comprising square wave functions, wherein the square wave functions are insensitive to AC amplitudes and DC components of the phase of the array beamlet and the phase of the reference plane wave.

3. The real-time control system of claim 2, wherein the algorithm further comprises phase correction calculations based on the phase measurement times modulo2π, such that a phase correction signal is transmitted to the phase modulators.

4. The real-time control system of claim 1, wherein the algorithm further comprises a phase measurement that calculates a difference between the phase of an array beamlet and the phase of the reference plane wave based on a phase angle of a complex number comprising sine and cosine functions to correct for harmonic content of the phase of the array beamlet and the reference plane wave, wherein the sine and cosine functions are insensitive to AC amplitudes and DC components of the phase of the array beamlet and the phase of the reference plane wave.

5. The real-time control system of claim 4, wherein the algorithm further comprises phase correction calculations based on the phase measurement times modulo2π, such that a phase correction signal is transmitted to the phase modulators.

6. The real-time control system of claim 1 further comprising:
a first fiber array that receives the array beamlets;
a first microlens array that receives the array beamlets from the first fiber array and outputs the composite beam;
a second microlens array that receives the composite beam and the reference plane wave; and
a second fiber array that receives the composite beam and the reference plane wave from the second microlens array and transmits the array beamlets and the reference plane wave to the photodetectors,
wherein the array beamlets diverge from the first fiber array and are collimated by the first microlens array, and the second microlens array focuses the array beamlets and the reference plane wave to the second fiber array.

7. The real-time control system of claim 6 further comprising:
a first beam splitter that splits the composite beam into an output beam; and
a second beam splitter that splits the reference plane wave into the composite beam as input to the second microlens array.

8. The real-time control system of claim 1 further comprising:
an analog to digital converter that converts photodetector output signals from the photodetectors into digital signals of the array beamlet phases and the reference plane wave phase;
a computing device that receives the digital array beamlet phases and the reference plane wave phase as input to the algorithm; and
a digital to analog converter that converts the phase correction from the algorithm into analog phase correction signals,
wherein the phase correction signals are transmitted to the phase modulators to vary the phases of the array beamlets.

9. The real-time control system of claim 8 further comprising:
a reference phase modulator that varies the phase of the reference beam; and
a trigger that uses the reference phase modulator to ramp the phase of the reference plane wave from 0 to 2π radians.

10. The real-time control system of claim 9, wherein the phase of the reference plane wave is ramped from 0 to 2π radians in four equally spaced steps.

11. The real-time control system of claim 9 further comprising an optical amplifier that amplifies output from the reference phase modulator.

12. The real-time control system of claim 1, wherein the reference plane wave is generated by a collimating lens.

13. The real-time control system of claim 1 further comprising a plurality of optical amplifiers that amplify the array beamlets after the phase modulators have realigned the phases of the array beamlets.

14. The real-time control system of claim 1, wherein the signal power splitter is a 3 dB passive coupler.

15. A method of measuring and controlling the optical phases of array beamlets in an optical phased array, the method comprising the steps of:
(a) transmitting a beam from a master oscillator laser to a signal power splitter;
(b) splitting the beam into a reference beam and a plurality of array beamlets;
(c) transmitting the array beamlets through a first fiber array and a first microlens array to generate a composite beam;
(d) transmitting the reference beam through a lens to form a reference plane wave, the reference plane wave comprising a phase;
(e) interfering the reference plane wave with the composite beam;
(f) transmitting the interfered reference plane wave and the composite beam through a second microlens array and a second fiber array to a plurality of photodetectors;
(g) detecting phases of the reference plane wave and the array beamlets;
(h) calculating a phase measurement, the phase measurement comprising a difference between the phase of the reference plane wave and the array beamlet phases;
(i) calculating phase corrections; and
(j) transmitting phase correction signals to a plurality of phase modulators to realign the array beamlets to compensate for external perturbations.

16. The method of claim 15, wherein step (h) further comprises the step of calculating the phase measurement based on a phase angle of a complex number comprising square wave functions, wherein the square waves are insensitive to AC amplitudes and DC components of the phase of the array beamlets and the phase of the reference plane wave.

17. The method of claim 16, wherein step (i) is based on the phase measurement times modulo2π.

18. The method of claim 15, wherein step (h) further comprises the step of calculating the phase measurement based on a phase angle of a complex number comprising sine and cosine functions to correct for harmonic content of phase measurements, wherein the sine and cosine functions are insensitive to AC amplitudes and DC components of the phase of the array beamlets and the phase of the reference plane wave.

19. The method of claim 18, wherein step (i) is based on the phase measurement times modulo2π.

20. A real-time optical phased array control system comprising:
a master oscillator laser that generates a beam;
a signal power splitter that splits the beam into a reference beam and a plurality of array beamlets, wherein each array beamlet comprises a phase;
a plurality of phase modulators corresponding to the array beamlets that vary the phases of the array beamlets;

a reference plane wave that is generated from the reference beam and is interfered with the array beamlets, the reference plane wave comprising a phase;

a first fiber array that receives the array beamlets;

a first microlens array that receives the array beamlets from the first fiber array and outputs a composite beam;

a second microlens array that receives the composite beam and the reference plane wave from the first microlens array;

a second fiber array that receives the composite beam and the reference plane wave from the second microlens array;

a plurality of photodetectors that receive the array beamlets and the reference plane wave from the second fiber array and detect the phase of the array beamlets and the phase of the reference plane wave; and an algorithm that calculates phase measurements and phase corrections to generate phase corrections signals for the phase modulators, wherein the phases of the array beamlets are aligned such that the array beamlets compensated for external perturbations.

21. The real-time optical phased array control system of claim 20, further comprising:

an analog to digital converter that converts photodetector output signals from the photodetectors into digital signals of the array beamlet phases and the reference plane wave phase;

a computing device that sends the digital array beamlet phases and the reference plane wave phase to the algorithm;

a digital to analog converter that converts the phase corrections from the algorithm into analog phase correction signal, and transmits the phase correction signals to the phase modulators to realign the phases of the array beamlets;

a reference phase modulator that varies the phase of the reference beam; and a trigger that uses the reference phase modulator to ramp the reference plane wave phase from 0 to $2\pi$ radians.

22. The real-time optical phased array control system of claim 21, wherein the phase of the reference plane wave is ramped from 0 to $2\pi$ radians in four equally spaced steps.

* * * * *